(12) United States Patent
Kurylak et al.

(10) Patent No.: US 7,257,505 B1
(45) Date of Patent: Aug. 14, 2007

(54) SYSTEM FOR CALIBRATING INTEGRATED CIRCUIT FILTERS

(75) Inventors: Alexander C. Kurylak, Wyomissing, PA (US); Narun Sooppipatt, Bangkok (TH); Iconomos A. Koullias, Wyomissing, PA (US); Esa Petri Tarvainen, Rovaniemi (FI); Peter Jivan Shah, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 0 days.

(21) Appl. No.: 11/300,047

(22) Filed: Dec. 14, 2005

Related U.S. Application Data

(60) Provisional application No. 60/636,375, filed on Dec. 15, 2004.

(51) Int. Cl.
*G01R 35/00* (2006.01)
(52) U.S. Cl. .................................................. 702/107
(58) Field of Classification Search ................ 702/107, 702/106
See application file for complete search history.

(56) References Cited

U.S. PATENT DOCUMENTS

| | | | |
|---|---|---|---|
| 6,549,766 B2 * | 4/2003 | Vorenkamp et al. | 455/307 |
| 6,622,099 B2 * | 9/2003 | Cohen et al. | 702/75 |
| 7,120,427 B1 * | 10/2006 | Adams et al. | 455/418 |

* cited by examiner

*Primary Examiner*—Bryan Bui
*Assistant Examiner*—Jonathan Moffat
(74) *Attorney, Agent, or Firm*—Michael W. Landry; Michelle P. Landry

(57) ABSTRACT

A main signal path filter is calibrated by calibrating a replica filter that tracks parametric changes in the main signal path filter. Programmed values of the replica filter determined during calibration are used to set programmed values in the main signal path filter. The main signal path filter signal does not need to be interrupted while calibration occurs. Power on testing of the main signal path filter and the replica filter can be performed to determine the parametric tracking relationship between the two filters.

17 Claims, 4 Drawing Sheets

SYSTEM FOR CALIBRATING INTEGRATED CIRCUIT FILTERS

RELATED APPLICATIONS

This application claims priority from U.S. provisional application No. 60/636,375 filed Dec. 15, 2004 entitled "System for Calibrating Integrated Circuit Filters", incorporated herein by reference.

BACKGROUND

1. Field of the Invention

The present invention relates to electronic signal filter calibration, specifically to filters implemented on integrated circuits.

2. Prior Art

Characteristics of circuit components created in monolithic integrated circuits change with processing variations, age, and temperature. When resistance, capacitance, or inductance of a circuit component change, the frequency, phase, or amplitude response of a filter employing the circuit component changes also. Where high filtering accuracy is needed, the change in filter response may be unacceptable.

Vorenkamp et al., U.S. Pat. No. 6,549,766 entitled "System and method for on-chip filter tuning" issued Apr. 15, 2003 discloses a method for calibrating on-chip filters using a substitute filter constructed on the same integrated circuit. The substitute or dummy filter is tuned using local oscillators, then the tuned component values are frequency scaled and applied to the operative filter in the main signal path. This reference teaches that for a wide band filter amplitude response is not the optimal parameter to monitor. At the filter center frequency the top of the response curve is flat making determination of the filter center difficult. The phase response has a steep slope at the center frequency and provides an easily discernable transition for determining when the center frequency has been reached. This reference uses detection of the phase slope to tune the center of the filter.

SUMMARY

The present invention calibrates integrated circuit filters to correct for component parameter changes that occur due to temperature, processing, aging, or other causes. A replica filter is created on the same integrated substrate as the filter being calibrated. A phase locked loop (PLL) signal synthesizer injects a test tone signal into the replica filter. Capacitors are switched in or out of the replica filter to achieve the desired filter response. The calibration can be performed at one frequency or at several frequencies. The calibration tone can be placed in the transition band between the pass band and stop band of the filter. In this region the filter characteristic changes very rapidly with frequency and hence component settings and therefore enables a very accurate calibration. A multipoint calibration can be done for even higher accuracy.

Once the replica filter is calibrated, the main signal filter for the tuner is adjusted with the same calibration values as used in the replica filter, or values derived from the replica filter calibration. There is an assumed correspondence to the replica filter and comparable changes can be inferred due to uniformity of device parameters across one die. The calibration method may be used with the replica filter or it may be use the signal filter path itself. In the former case, the filter can be recalibrated during signal reception without disturbing the signal path. In the latter case, the signal path will be interrupted during calibration but the calibration will be much more accurate since it will not be affected by any mismatches between replica and main filter.

Very high accuracy can be achieved by power on calibrating the main signal path filter and the replica filter to determine the parametric tracking relationship between the two filters. Then by calibrating the replica filter and using the tracking relationship the main signal path filter signal does not need to be interrupted while calibration occurs.

DETAILED DESCRIPTION OF THE INVENTION

An application of the present system for calibrating integrated circuit filters is an integrated circuit digital television tuner (DTV). The DTV tuner uses a low pass filter comprised of many cascaded stages to perform the base band filtering function, for example using elliptic filter stages. The base band filter can be implemented as a cascade of lower-order filter sections with variable gain amplifiers (VGAs) in between. The filter accuracy desired is +2% to achieve proper adjacent channel rejection. Other filter specifications are possible. Generally, in most applications the ultimate purpose of the calibration is to achieve the best compromise between attenuating the adjacent channels sufficiently and avoiding excessive in-channel signal loss. Therefore, it is advantageous to place the calibration tone in the transition band.

The filter calibration circuit uses a phase locked loop (PLL) to generate a test tone and feeds it through a replica of the tuner main signal filter. While described in terms of an elliptic low pass filter, the method of the present invention will work for any kind of filter section or cascade of sections, including a copy of the entire filter or even, as mentioned above, not using a replica but rather the signal filter itself. The calibration circuit steps through the tuning bits until the desired attenuation is reached. The tuning is not necessarily fully digital. It can be fully analog or a combination of digital coarse tuning and analog fine tuning. This method allows for very accurate tuning. The filter tuning is performed by switching capacitors with, for example, 8 bits for 256 settings. The filter tuning can be controlled, for example, by an I2C (I-squared C) digital control bus directly, or can be determined using the calibration circuit.

The complete calibration block is made up of an analog section that contains the PLL, the replica filter and the detectors and comparators, a digital state machine to control everything, and an optional thermometer block which determines the temperature and works in conjunction with the state machine in the thermal mode.

Figure 1:
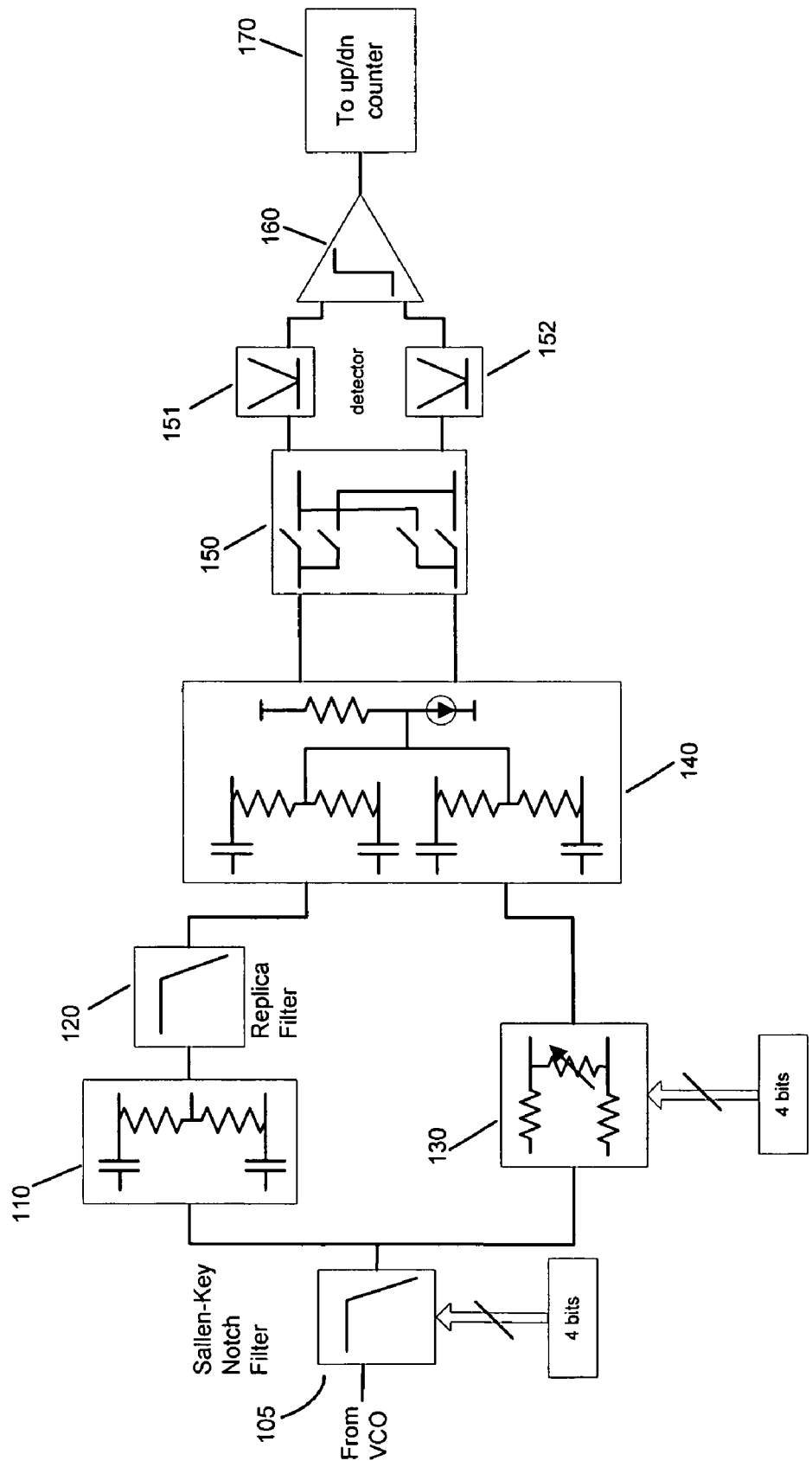
FIG. 1 shows the signal path block diagram for the replica filter calibration of the present invention.

FIG. 1 show a block diagram of the signal processing for calibrating the replica filter. The input to the analog path is a square wave input from a voltage-controlled oscillator (VCO) that is part of the PLL circuit. Harmonic frequencies of the input then are attenuated by fourth-order Sallen-Key- Notch Filter 105 to produce a clean sinusoidal signal. Other types of filter topology can be used to achieve the same objective. The clean sinusoidal signal is passed to both replica filter 120 and attenuator 130. Replica filter 120 is, for example, an Elliptic filter. The PLL does not have to produce a square wave signal; it is advantageous if it produces a sinusoid because then the Sallen-Key filter is not needed.

Sallen-Key-Notch filter 105 consists of two cascaded second-order filters. The first stage is a 2-pole Sallen-Key filter 105, and the second stage is a 2-pole Notch filter. The corner frequency of the filter is programmable with 4 bits of resolution, and can be programmed to match the PLL frequency generated or another frequency reference. The test tone generated changes as the tuner tracking filters bandwidth is changed, for example in the case where the tuner is used for different television systems. The main signal path filter is programmable to support different channel bandwidths. Therefore, the calibration tone must also be placed at different frequencies and the PLL cleanup filter may need some limited programmability in order to filter out harmonics of the square wave. This further illustrates why a sinusoidal tone is preferred.

Programmable attenuator 130 is used to attenuate the reference frequency tone, with a desired attenuation, in order to be compared with replica filter attenuation. This circuit is a resistive divider circuit with 16 switches in parallel to achieve 16 different attenuation settings ranging from −3 dB to −10 dB, with 0.46 dB steps, for example. The signals from both the replica filter and attenuator paths are passed into peak detectors 151 and 152, and the outputs from each peak detector are compared with comparator 160. Digital output of comparator 160 is passed into up/down 170 counter to control both the replica and/or signal path filter component settings. The 4 bits are set by software control to identify the amount of attenuation that the filter should be tuned to at the calibration tone frequency.

Elements 110 and 140 provide optional AC coupling and can be used for elimination of DC biasing issues. Switch 150 allows swapping the two arms for compensation of the peak detectors. Switch 150 is optional but provides the benefit of removing possible DC offset from the replica filter that might skew the comparison measurement in the peak detectors.

Optional temperature sensing is used to trigger a calibration. This provides the benefit of only re-calibrating the filter during signal reception when necessary, namely when the temperature changes more than a prescribed amount. In continuous reception systems such as TV reception, it is usually not acceptable to interrupt the signal path for repeated re-calibration. Therefore, it may be necessary to use a replica filter for measuring calibration needed of the main signal path filter. However, if the temperature triggering is used the recalibration would be so rare that it might be acceptable to calibrate on the signal path filter itself and eliminate the replica filter, which saves circuit area. When a temperature trigger initiates calibration, the filter can begin at the current frequency setting and be adjusted in the direction that corresponds to the temperature change direction, which can be positive or negative relationship and can be determined by design or factory testing.

A temperature sensing circuit can be incorporated on the integrated circuit. The overall function of the temperature sensing circuit is to feed the I2C a digital word that represents the temperature of the integrated circuit chip or general proximity where the circuit is located and to also restart the RC calibration if the temperature drifts a certain amount from a settled value. This function is performed by a band gap, a window comparator, an up/down counter, and some digital logic, using well-known techniques. The band gap outputs a current signal proportional to absolute temperature (ptat), or some other function of temperature, and a constant current, both of which are sunk through resistors to produce voltages. These voltages are compared by a window comparator with the outputs fed to an up/down counter. The output of the counter is the output digital word, which also is fed back to change the ptat current value. The circuit continues to run until the output word selects the correct ptat current so that the ptat voltage is within the window of the constant voltage. There are two windows for the comparator, ~±5° C. and ~±20° C. These windows are selectable through the "accurate" input pin and it is controlled by the "keepclk" output bit. This performs a digital hysteresis so that if the temperature varies by ~±20° C. after settling, the calibration resumes. The "keepclk" signal is also fed to the top-level RC calibration digital control block that enables the RC cal clock when high.

In an example embodiment, the digital section is made up of D flip-flops to divide the input clock down, a flip-flop to latch in the enable pulse, muxes, and logic gates. This state machine has 3 modes: onetime, thermal, and continuous. The onetime mode runs through 256 clock periods to find the correct tuning bit pattern. The correct tuning may be found before all 256 periods have completed, but the clock still keeps pulsing. The tuning word will toggle around the correct setting until the calibration has finished. For the thermal mode, if the temperature varies by ±20° C., the calibration circuit is activated until the new temperature is found by the thermometer. The continuous mode continuously calibrates with a very slow clock (fclk/(2^20)) until it is deactivated.

Figure 2:
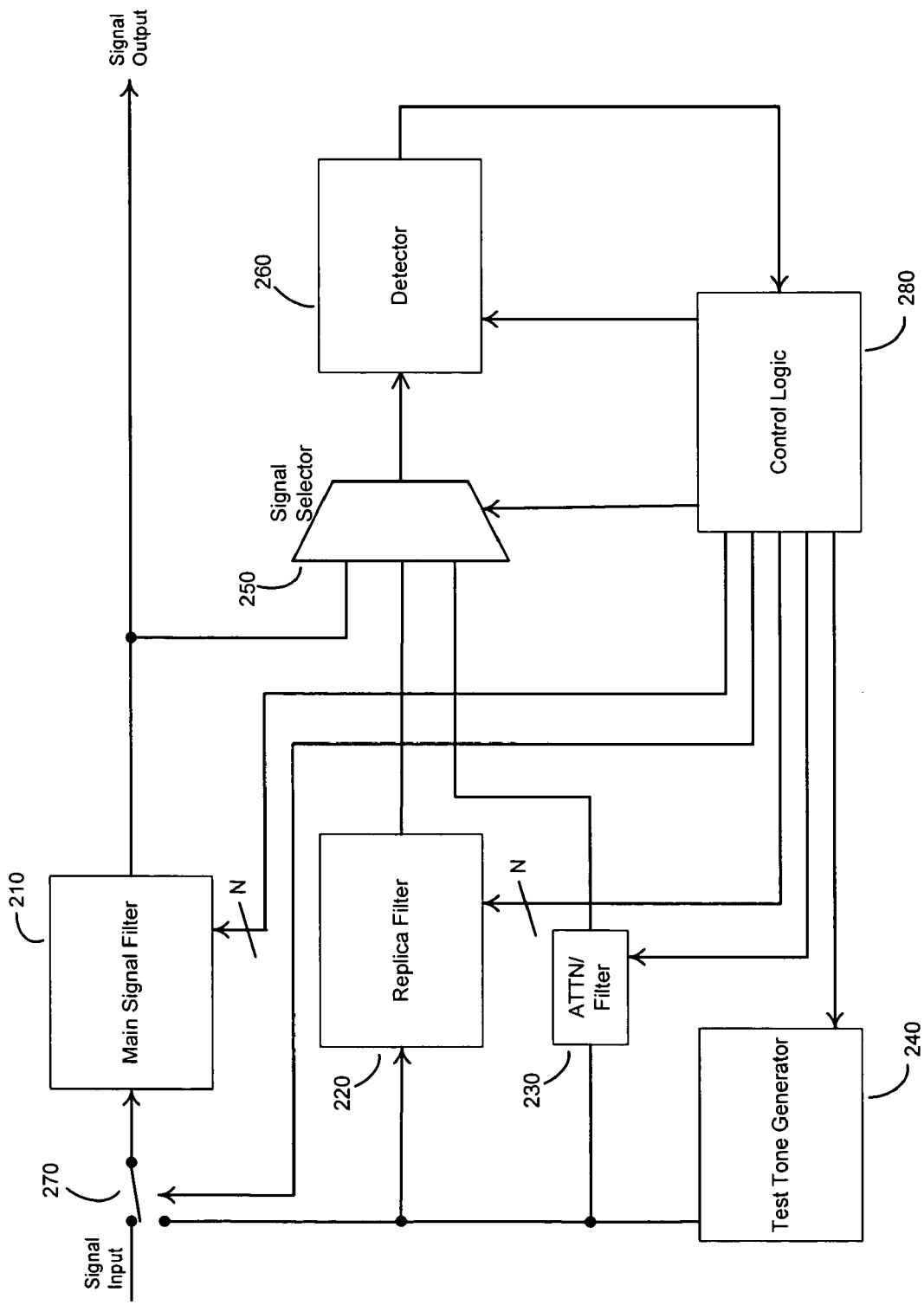
FIG. 2 shows the filter calibration system of the present invention.

FIG. 2 shows the filter calibration system of the present invention. Test tone generator 240 creates a test signal that can be directed to the main filter 210, replica filter 220, or through a programmable attenuator 230 with optional filtering to the detector block 260. The detector block 260 can detect the power or amplitude difference between the paths, and use the comparison to change filter component values until the amplitudes or power levels are equal. This way the replica or main filter is adjusted, for example, by adjusting the filter corner frequency such that it provides an attenuation of the test tone, which is equal to the attenuation through the attenuator.

The test tone can be routed either through the replica or main filter into the detector. This enables quantifying the difference between the replica and main filter and subsequently use that information to adjust the calibration values when the replica filter is used. This way the mismatch between the main filter and the replica can be compensated and very accurate subsequent calibrations can be achieved without interrupting the signal path. Switch 270 controlled by control logic 280 is used to select signal inputs to the main signal filter 210; the switch 270 selects between the normal signal input or a calibration tone from test tone generator 240. A switched connection from the main filter 210, replica filter 220, or attenuator 230 output to the detector input is provided through the signal selector 250. Control logic 280 performs program settings and sequencing of the filter calibration circuit.

Figure 3:
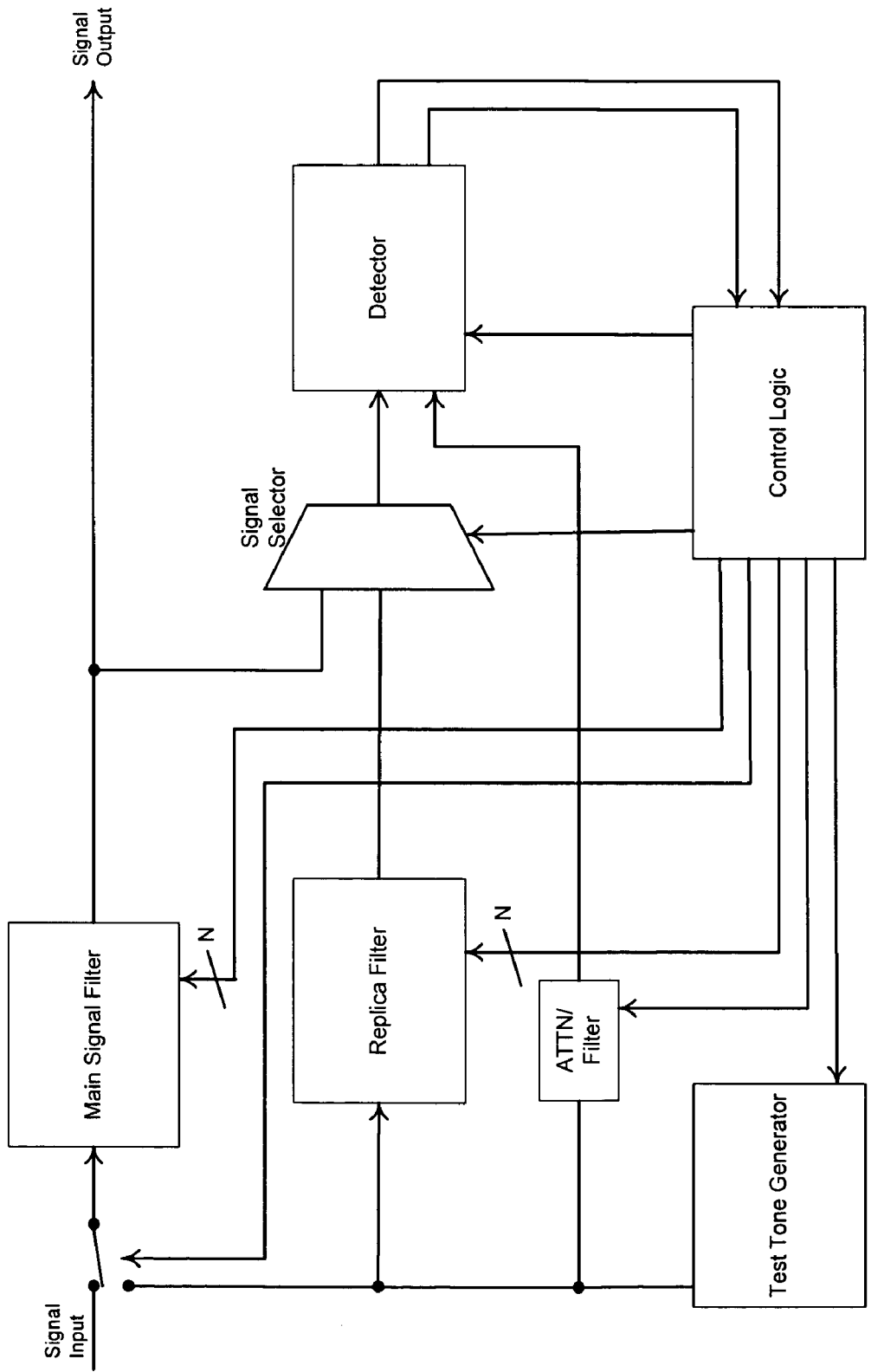
FIG. 3 shows an alternate embodiment of the present filter calibration system.

FIG. 3 shows an alternate embodiment of the present invention where the signal selector selects between the main filter signal and the replica filter signal to route to a detector, and the test tone is routed to another detector used for the test tone only. This embodiment allows simultaneous detection of amplitude of two signals.

Figure 4:
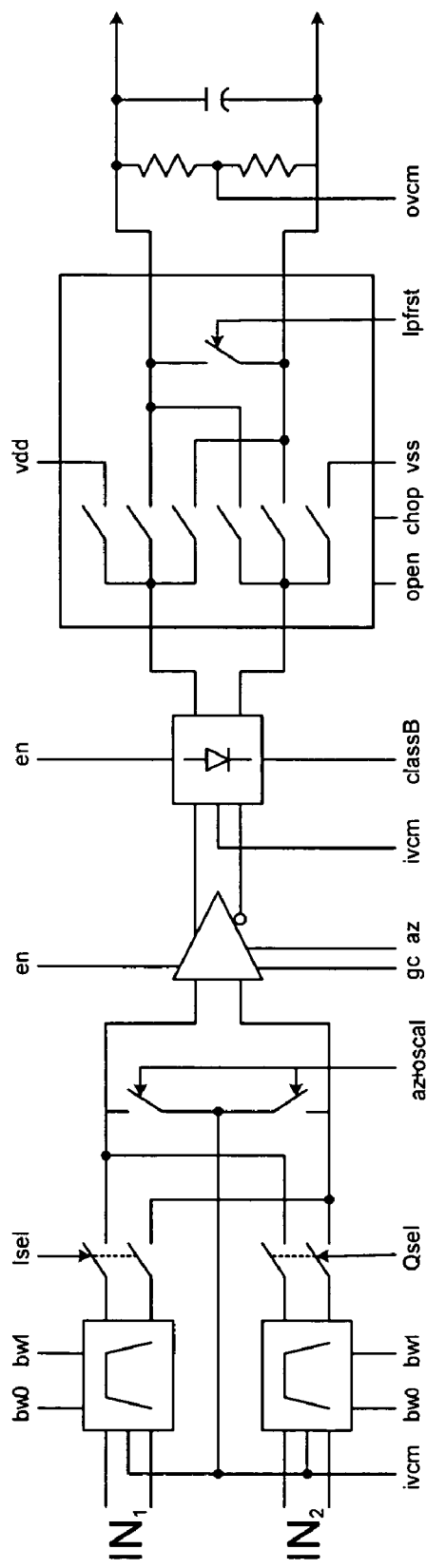
FIG. 4 shows a block diagram of an amplitude difference detector.

FIG. 4 shows an example absolute difference detector circuit for use with the present invention. The difference detector is described more fully in co-pending patent application and commonly assigned U.S. patent application filed Dec. 14, 2005, Ser. No. 11/300,046, entitled "In-phase and Quadrature-phase Signal Amplitude and Phase Calibration" by Richard Fortier, Andy Lau, and Peter Shah, which claims priority from U.S. provisional application No. 60/636,581 filed Dec. 16, 2004 entitled "In-phase and Quadrature-phase Signal Amplitude and Phase Calibration", incorporated herein by reference.

What is claimed is:

1. A method of calibrating a signal filter comprising the steps of:
    applying a sinusoidal test tone to a replica filter in the transition band of the replica filter;
    calibrating the replica filter amplitude at the test tone frequency and producing replica filter calibration values;
    using the replica filter calibration values to calibrate the signal filter.

2. The method of claim 1 further comprising the steps of:
    determining the parametric tracking relationship between the signal filter and the replica filter;
    programming the signal filter using the filter calibration values and the tracking relationship.

3. The method of claim 1 further comprising the steps of:
    measuring the temperature of the signal filter; and
    detecting a change in temperature and performing a new calibration of the signal filter if the temperature change exceeds a predetermined value.

4. The method of claim 1 wherein the replica filter is continuously calibrated and the signal filter is calibrated when the replica filter calibration values change.

5. An integrated circuit filter with calibration comprising:
    a main signal path filter with programmable characteristics;
    a replica filter with programmable characteristics, wherein the replica filter tracks parameter changes occurring in the main signal path filter;
    a sinusoidal test tone generator that injects a tone into the replica filter in the transition band;
    a detector for detecting the amplitude output of the replica filter and setting a programmable characteristic of the replica filter; and
    means for setting the main signal path filter programmable characteristics with settings used for the replica filter.

6. The integrated circuit filter of claim 5 further comprising:
    a temperature sensor wherein calibration of the main signal path filter is performed if the temperature changes by a predetermined amount.

7. The integrated circuit filter of claim 5 wherein the test tone generator has an adjustable frequency.

8. A method of calibrating a programmable filter used in a tuner to a desired frequency band, the method comprising the steps of:
    generating a sinusoidal test signal, the test signal frequency selected to be in the transition region of the desired frequency band;
    applying the test signal to the programmable filter;
    applying the test signal to an attenuator;
    comparing amplitudes of the outputs of the programmable filter and the attenuator;
    adjusting the programmable filter corner frequency to cause the filter output level to match the attenuator output level.

9. The method of claim 8 wherein the programmable filter is a replica filter and calibration values for the replica filter are used to program a signal filter.

10. The method of claim 8 wherein the programmable filter is a main filter.

11. The method of claim 8 wherein the attenuator has a programmable attenuation level.

12. The method of claim 8 wherein the test signal frequency is programmable.

13. The method of claim 8 further comprising the steps of:
    measuring the filter temperature;
    initiating a calibration if the temperature changes by more than a predetermined amount.

14. The method of claim 13 wherein the step of adjusting the programmable filter corner frequency starts at the filter frequency programmed when calibration begins and the corner frequency is adjusted in the direction determined by the temperature change direction.

15. A calibrator for a programmable filter used in a tuner to set a desired frequency band, the calibrator comprising:
    a frequency generator for generating a sinusoidal test signal, the test signal frequency selected to be in the transition region of the desired frequency band;
    the test signal coupled to the programmable filter;
    the test signal coupled to an attenuator;
    a comparing circuit that compares the amplitude output of the programmable filter and the attenuator; and
    a control circuit that adjusts the programmable filter corner frequency to cause the filter output level to match the attenuator output level.

16. The calibrator of claim 15 further comprising a temperature sensor that initiates a filter calibration when the temperature changes by more than a predetermined amount.

17. The calibrator of claim 15 wherein the attenuator is programmable.

* * * * *